US006985374B2

(12) United States Patent
Yamamura

(10) Patent No.: US 6,985,374 B2
(45) Date of Patent: Jan. 10, 2006

(54) FERROELECTRIC MEMORY DEVICE

(75) Inventor: Mitsuhiro Yamamura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 135 days.

(21) Appl. No.: 10/758,179

(22) Filed: Jan. 16, 2004

(65) Prior Publication Data

US 2004/0190324 A1    Sep. 30, 2004

(30) Foreign Application Priority Data

Jan. 17, 2003    (JP)    ............................ 2003-010153

(51) Int. Cl.
*G11C 11/22*    (2006.01)
(52) U.S. Cl. ................... 365/145; 365/63; 365/149
(58) Field of Classification Search ................ 365/145, 365/149, 63, 230.03, 230.06
See application file for complete search history.

(56) References Cited

U.S. PATENT DOCUMENTS

| | | | | |
|---|---|---|---|---|
| 5,487,029 A | * | 1/1996 | Kuroda | ........................ 365/145 |
| 5,550,770 A | * | 8/1996 | Kuroda | ........................ 365/145 |
| 2004/0042249 A1 | * | 3/2004 | Weng et al. | ................. 365/145 |
| 2004/0208041 A1 | * | 10/2004 | Maruyama | ................... 365/117 |
| 2004/0213033 A1 | * | 10/2004 | Maruyama | ................... 365/145 |

FOREIGN PATENT DOCUMENTS

| JP | A 7-235648 | 9/1995 |
|---|---|---|
| JP | A 9-116107 | 5/1997 |

OTHER PUBLICATIONS

U.S. Appl. No. 10/393,439, filed Mar. 20, 2003, Yamamura.
U.S. Appl. No. 10/747,395, filed Dec. 30, 2003, Maruyama.
U.S. Appl. No. 10/717,523, filed Dec. 30, 2003, Maruyama.
U.S. Appl. No. 10/737,959, filed Dec. 18, 2003, Maruyama.
U.S. Appl. No. 10/747,523, filed Dec. 30, 2003, Maruyama.

* cited by examiner

*Primary Examiner*—Gene N. Auduong
(74) *Attorney, Agent, or Firm*—Oliff & Berridge, PLC

(57) ABSTRACT

A ferroelectric memory device including a memory cell array region having reduced influence of disturbance noise and divided into row blocks for every sub-bitline subordinate to main bitlines. One end of each sub bitline is connected to the main bitline through a first sub bitline select switch. The other end of the sub bitline is connected to a common potential supply line through a second sub-bitline select switch which is turned on complementarily with the first sub-bitline select switch.

15 Claims, 7 Drawing Sheets

FERROELECTRIC MEMORY DEVICE

Japanese Patent Application No. 2003-10153 filed on Jan. 17, 2003, is hereby incorporated by reference in its entirety.

BACKGROUND OF THE INVENTION

The present invention relates to a ferroelectric memory device.

As a ferroelectric memory device, an active ferroelectric memory device including 1T/1C cells in which one transistor and one capacitor (ferroelectric) are disposed in each memory cell, or including 2T/2C cells in which a reference cell is further disposed in each memory cell, has been known.

However, since the active ferroelectric memory device has a large memory area in comparison with a flash memory or EEPROM which is known as a nonvolatile memory device in which a memory cell is formed by one element, the capacity cannot be increased.

A ferroelectric memory device in which each memory cell is formed by one ferroelectric capacitor is known (Japanese Patent Application Laid-open No. 9-116107). Japanese Patent Application Laid-open No. 9-116107 discloses hierarchization of bitlines. Specifically, a plurality of sub-bitlines subordinate to one main bitline through a plurality of connection means are provided. One main bitline can be connected with one sub-bitline selected by turning on only one of the connection means. This prevents a voltage from being applied to the unselected memory cells connected with other sub-bitlines, whereby the number of disturbances applied to the unselected memory cells can be limited.

However, the sub-bitline connected with the connection means which is turned off is in a floating state. In this case, the interconnect potential may be changed if noise is applied from the outside, whereby data stored in the ferroelectric capacitors connected with the sub-bitline may be destroyed.

Japanese Patent Application Laid-open No. 7-235648 discloses a ferroelectric memory device which includes a plurality of blocks divided in units of sub-bitlines in the same manner as described above and in which each of the blocks is further divided into a plurality of sub-blocks. The block selected from among the plurality of blocks (selected block) is divided into a selected sub-block and an unselected sub-block. In the selected block, the sub-bitlines do not float in the selected sub-block and the unselected sub-block.

However, the potential of the sub-bitlines is in a floating state in all the unselected sub-blocks in the unselected blocks.

BRIEF SUMMARY OF THE INVENTION

The present invention may provide a noise-resistant ferroelectric memory device while hierarchizing bitlines and/or wordlines without causing sub-bitlines and/or sub-wordlines connected with unselected memory cells to be in a floating state.

According to one aspect of the present invention, there is provided a ferroelectric memory device comprising:

a memory cell array region;

a plurality of wordlines arranged in parallel to each other in a first direction within the memory cell array region;

a plurality of main bitlines arranged in parallel to each other in a second direction intersecting the first direction within the memory cell array region;

a plurality of blocks into which the memory cell array region is divided in the second direction;

a plurality of sub-bitlines provided for each of the main bitlines, each of the sub-bitlines being provided within one of the blocks;

a plurality of ferroelectric memory cells respectively provided at intersections between the sub-bitlines and the wordlines;

a plurality of first sub-bitline select switches respectively provided between the main bitlines and one ends of the sub-bitlines;

a common potential supply line which supplies a common potential to the sub-bitlines;

a plurality of second sub-bitline select switches respectively provided between the common potential supply line and the other ends of the sub-bitlines; and a plurality of block select sections provided corresponding to the blocks, wherein one of the block select sections selected from among the block select sections turns on the first sub-bitline select switches and turns off the second sub-bitline select switches in corresponding one of the blocks; and wherein unselected block select sections among the block select sections turn off the first sub-bitline select switches and turn on the second sub-bitline select switches in corresponding two or more of the blocks.

The sub-bitlines in the selected block are connected to the main bitlines through the first sub-bitline select switches, and the sub-bitlines in the unselected blocks are connected to the common potential supply line through the second sub-bitline select switches. This prevents all the sub-bitlines in the selected and unselected blocks from floating, whereby the influence of disturbance noise can be reduced.

In a ferroelectric memory device according to another aspect of the present invention, the wordlines are hierarchized instead of the bitlines. Each main wordline is connected to one end of a sub-wordline through a first sub-wordline select switch, and a common potential supply line is connected to the other end of the sub-wordline through a second sub-wordline select switch in the same manner as described above. The sub-wordlines are prevented from floating by complementarily turning on the first and second sub-wordline select switches during memory access. Therefore, the influence of disturbance noise can be reduced.

According to yet another aspect of the present invention, both the bitlines and the wordlines are hierarchized. In the unselected block, the sub-bitlines are connected to the second common potential supply line through the second sub-bitline select switches, and the sub-wordlines are connected to the first common potential supply line through the second sub-wordline select switches. This prevents the sub-bitlines and the sub-wordlines from floating. Therefore, since the common potential is applied to both ends of each memory cell in the unselected block, the potential difference becomes 0 V, whereby the nonvolatile state can be maintained without being influenced by disturbance noise.

The common potential may be set as follows. The common potential supplied to the sub-bitlines may be substantially the same as an unselected wordline potential supplied to the unselected blocks. Similarly, the common potential supplied to the sub-wordlines may be substantially the same as an unselected bitline potential supplied to the unselected blocks. This enables the voltage applied to all the memory cells in the unselected blocks to be set at 0 V.

The common potential may be supplied to the sub-bitlines and/or the sub-wordlines of all the memory cells during a standby period in which no block is selected. In this case, the common potential may be substantially the same as a bitline potential and/or a wordline potential during the standby period. This enables the voltage applied to all the memory cells to be set at 0 V during the standby period. These potentials may be set to be substantially the same as the potential of the common potential supply line during an operation period, in the standby period after turning the power on. This enables charge/discharge current of each line to be reduced when transitioning from the standby period to the operation period, whereby the transitioning time can be reduced.

In the case in which the first and second common potential supply lines are used, the first and second common potential supply lines may be connected to different test terminals. This enables different potentials to be supplied to the first and second common potential supply lines during a test period. Therefore, the logical value "0" or "1" can be simultaneously written into all the memory cells in the test period.

DETAILED DESCRIPTION OF THE EMBODIMENTS

1. First Embodiment

Figure 1:
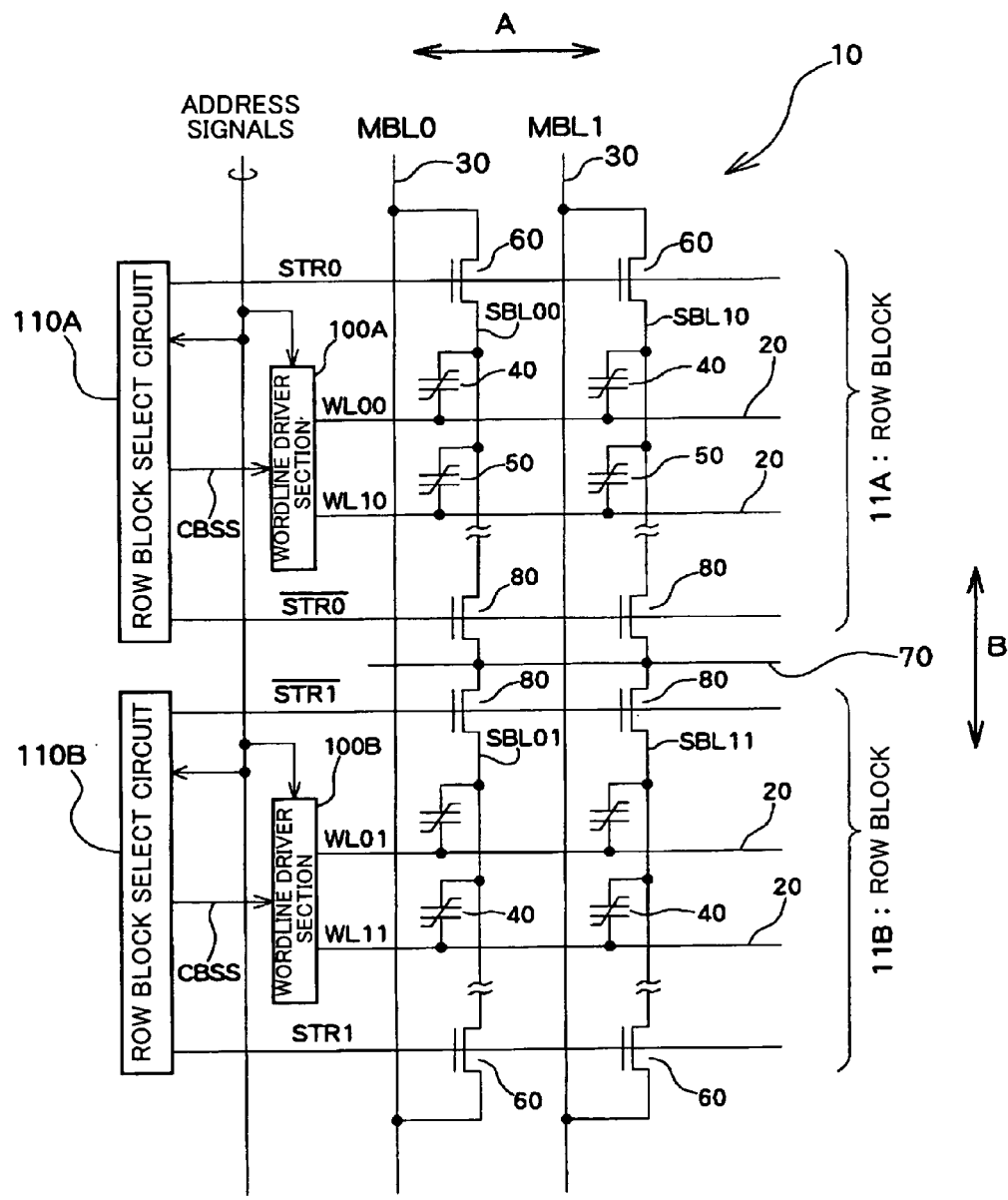
FIG. 1 is a diagram schematically showing a ferroelectric memory device according to a first embodiment of the present invention.

FIG. 1 shows a first embodiment of the present invention. In a memory cell array region 10 shown in FIG. 1, a row direction A in which wordlines 20 extend is defined as a first direction, and a column direction B in which hierarchized main bitlines 30 and sub-bitlines 40 extend is defined as a second direction. However, the present invention is not limited thereto. The memory cell array region 10 shown in FIG. 1 is divided into a plurality of row blocks 11A, 11B, . . . at least in the column direction B.

Wordline driver sections 100A and 100B and row block select circuits 110A and 110B are provided corresponding to the row blocks 11A and 11B, respectively.

The memory cell array region 10 is described below. In the present embodiment, the bitlines are hierarchized. Specifically, the sub-bitline 40 is provided for each of the main bitlines 30 in each of the row blocks 11A and 11B. In the row block 11A, the sub-bitline SBL00 is provided for the main bitline MBL0, and the sub-bitline SBL10 is provided for the main bitline MBL1. In the row block 11B, the sub-bitline SBL01 is provided for the main bitline MBL0, and the sub-bitline SBL11 is provided for the main bitline MBL1.

Ferroelectric capacitors (memory cells) 50 are provided at intersections of the sub-bitlines 40 subordinate to the main bitlines 30 and the wordlines 20.

A first sub-bitline select switch 60 is provided between the main bitline 30 and one end of the sub-bitline 40. A common potential supply line 70 which supplies a common potential to the sub-bitlines 40 is provided between the row blocks 11A and 11B. A second sub-bitline select switch 80 is provided between the other end of the sub-bitline 40 and the common potential supply line 70. The first and second sub-bitline select switches 60 and 80 connected with either end of one sub-bitline 40 are driven complementarily so that one of the first and second sub-bitline select switches 60 and 80 is turned on when the other is turned off. Therefore, one sub-bitline 40 is connected with the main bitline 30 when the first sub-bitline select switch 60 is turned on, and connected with the common potential supply line 70 when the second sub-bitline select switch 80 is turned on. This prevents the sub-bitline 40 from floating.

Figure 2:
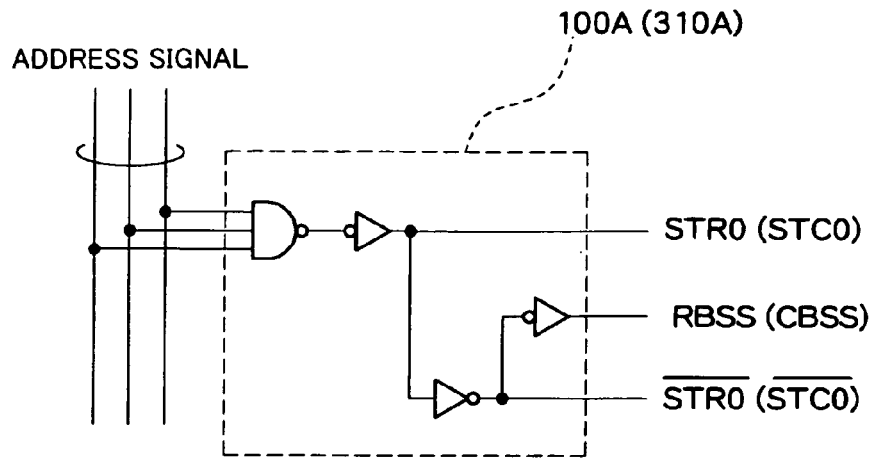
FIG. 2 is a circuit diagram showing a row block select circuit and a column block select circuit according to the present invention.

FIG. 2 shows an example of the row block select circuit 110A shown in FIG. 1. In FIG. 2, three address signal lines 120 to 122 are provided, for example. The row block select circuit 110A to which the address signal lines 120 to 122 are connected is formed by using one NAND gate and three inverters, for example.

If the potentials of all the address signal lines 120 to 122 are HIGH (HIGH active), the row block select circuit 110A judges that the row block 11A is selected. When the row block select circuit 110A selects the row block 11A, a signal STR0 goes HIGH, an inverted signal /STR0 of the signal STR0 goes LOW, and a row block select signal RBSS goes HIGH.

The row block select circuit 110A does not select the row block 11A if the potential of at least one of the address signal lines 120 to 122 is LOW, and the logic of the signals STRR0,/STR0 and RBSS is the reverse of that when selecting the row block 11A.

Other row block select circuits such as the row block select circuit 110B selectively drive the corresponding row blocks based on the same principle.

Figure 3:
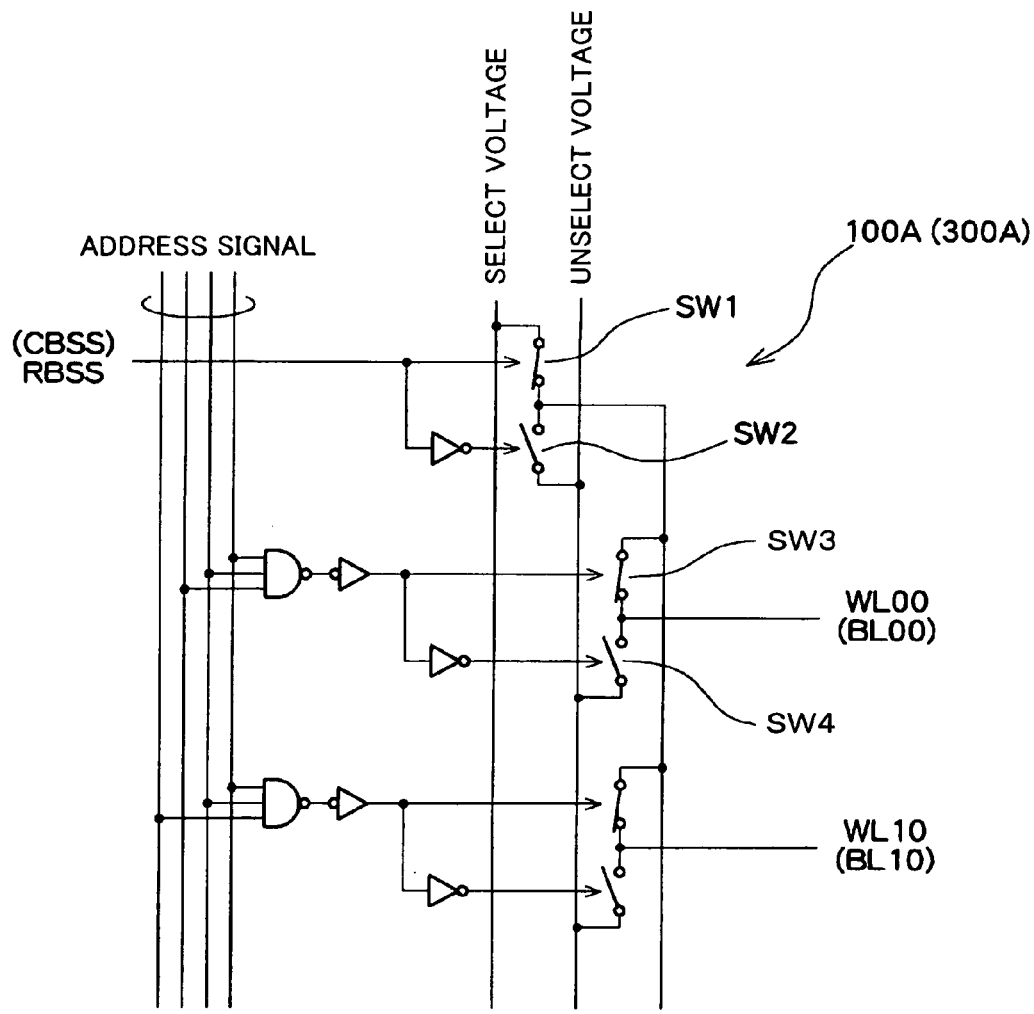
FIG. 3 is a circuit diagram showing a wordline driver section and a bitline driver section according to the present invention.

FIG. 3 shows an example of the wordline driver section 100A shown in FIG. 1. The wordline driver section 100A determines whether or not to supply a select voltage (selected word voltage) based on the row block select signal RBSS output from the row block select circuit 110A. The wordline driver section 100A includes a switch SW1 which controls supply of the selected word voltage based on the row block select signal RBSS, and a second switch SW2 which controls supply of an unselect voltage (unselected word voltage) based on the inverted signal of the row block select signal RBSS.

The wordline driver section 100A further includes a third switch SW3 which selects the selected word voltage supplied through the switch SW1, and a fourth switch SW4 which selects the unselected word voltage in units of the wordlines 20 in the row block 11A (FIG. 3 shows only the configuration corresponding to the wordline WL00). The switch SW3 is driven by a signal which goes HIGH only when the first wordline WL00 in the row block 11A is selected, and the switch SW4 is driven by its inverted signal. The switches SW1 to SW4 may be formed by using a transistor or a transfer gate.

This ferroelectric memory device is a memory device which utilizes two polarization states which appear in a hysteresis curve of the ferroelectric capacitor 50 as one bit.

Figure 4:
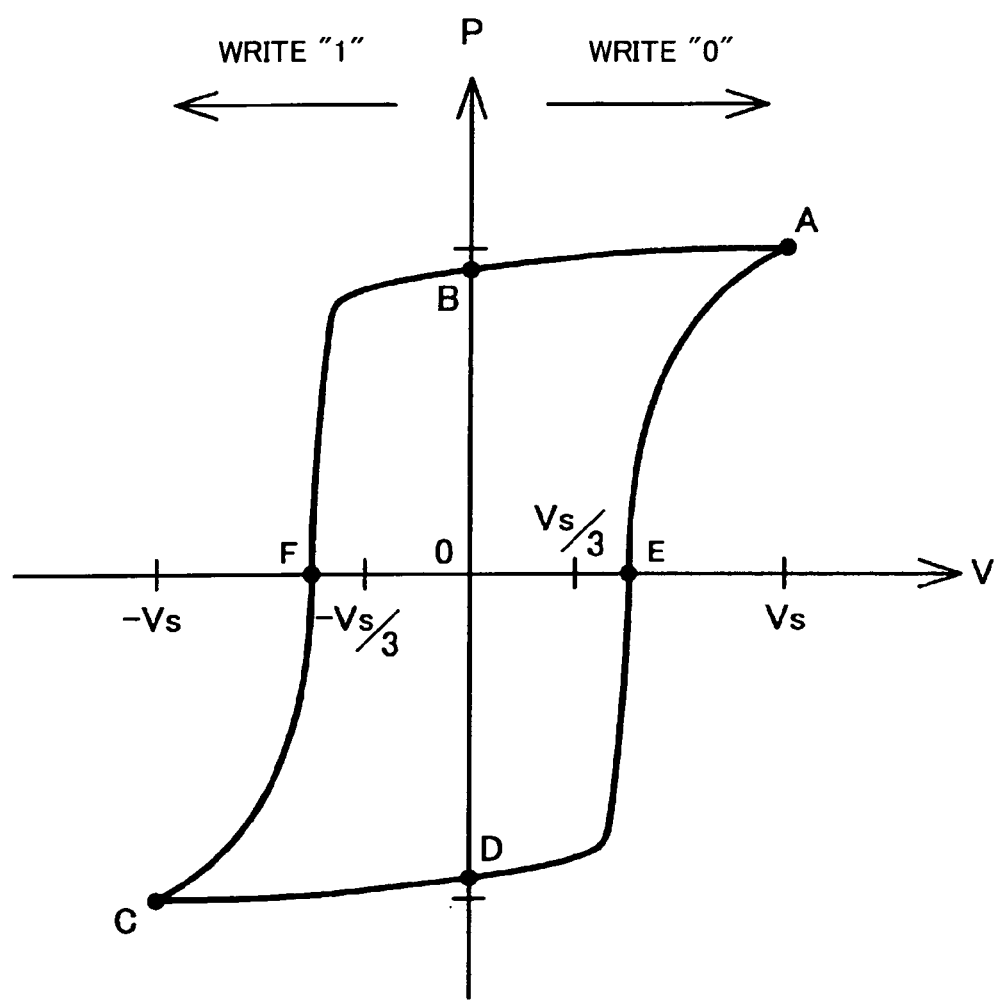
FIG. 4 is a graph showing the hysteresis curve of a ferroelectric according to the present invention.

FIG 4 shows the correlation between the voltage applied to the ferroelectric and the polarization of the ferroelectric in the hysteresis curve according to the present invention. In FIG. 4, the vertical axis P indicates the polarization of the ferroelectric, and the horizontal axis V indicates the voltage applied to the ferroelectric. The curve shown in FIG. 4 shows characteristics in which the polarization state of the ferroelectric capacitor 50 cycles corresponding to the change in the voltage applied to the ferroelectric capacitor 50. For example, when a select voltage Vs is applied to the ferroelectric capacitor 50 which is in a state at a point B (memory state of logical value "0") or a state at a point D (memory state of logical value "1"), the polarization state transitions to a point A (reading of logical value "0" or "1"). When the applied voltage is changed to 0, the polarization state transitions to the point B. Specifically, the polarization state which is originally at the point D also transitions to the point B through the point A. When a select voltage −Vs is applied to the ferroelectric capacitor 50, the polarization state transitions to a point C (writing of logical value "1"). When the applied voltage is changed to 0, the polarization state transitions to the point D (memory state of logical value "1").

Consider the case where an unselect voltage ±Vs/3 is applied to the ferroelectric capacitor 50 which is in a polarization state at the point B or the point D. When the applied voltage is changed to 0, the polarization state returns to the original point B or point D. This shows that the memory state is maintained even if the unselect voltage ±Vs/3 is applied to the unselected ferroelectric capacitor 50 in a period in which one of the ferroelectric capacitors 50 is selected.

Figure 5:
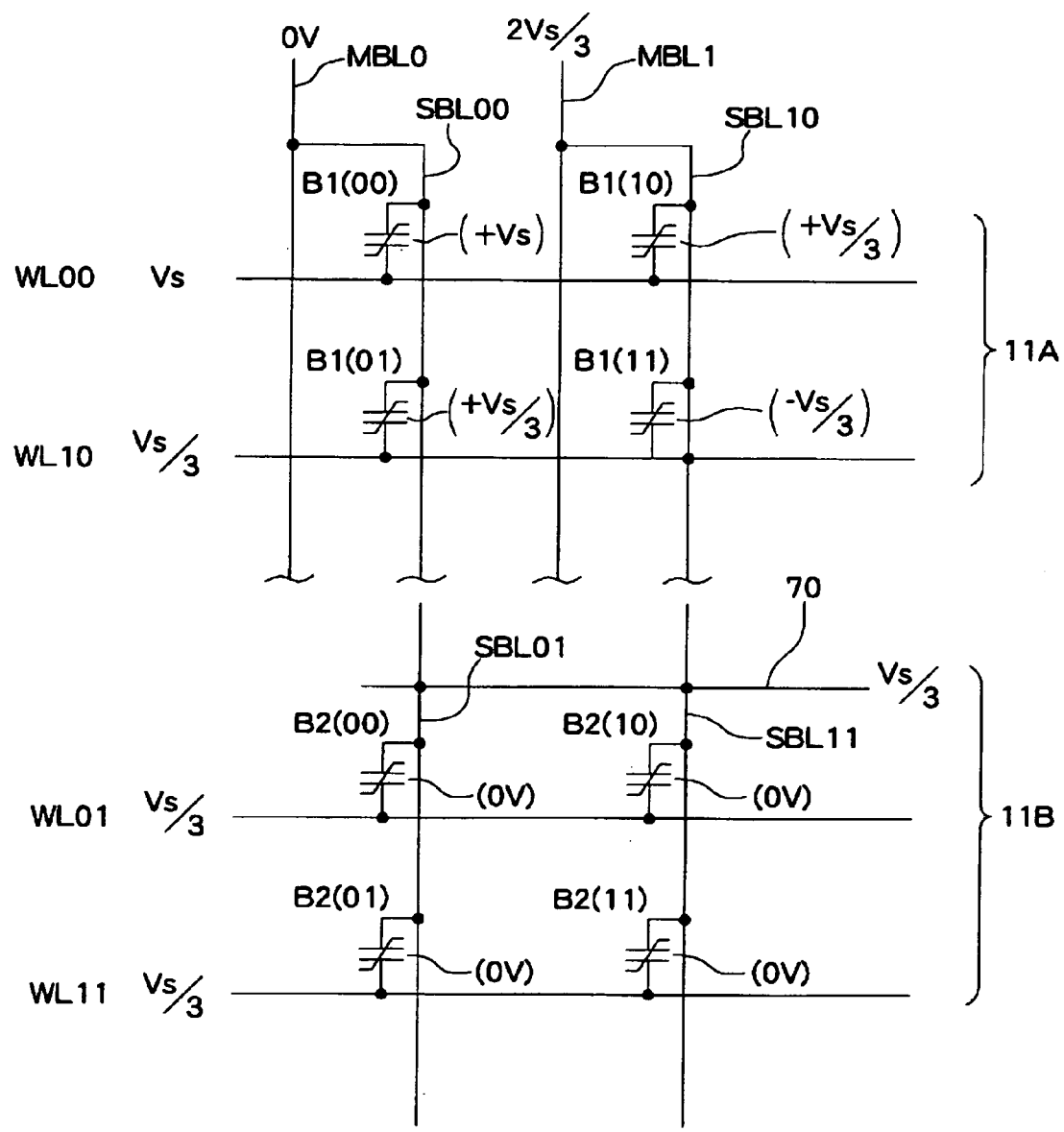
FIG. 5 is a diagram showing voltages applied to the ferroelectric memory device shown in FIG. 1 during a read operation.

FIG. 5 shows a potential setting in the case of reading data from the memory cell in the selected row block 11A of the memory cell array 10 shown in FIG. 1 (or in the case of writing logical value "0"). The selected memory cell is a memory cell B1(00) connected with the wordline WL00 and the sub-bitline SBL00 in the row block 11A. In the row block 11A, the signals STR0, /STR0, and RBSS, the wordlines WL00 and WL10, and the sub-bitlines SBL00 and SBL10 are set at potentials shown in Table 1.

TABLE 1

| Potentials in row block 11A | | | | | | |
|---|---|---|---|---|---|---|
| STR0 | /STR0 | RBSS | WL00 | WL10 | SBL00 | SBL10 |
| H | L | H | Vs | Vs/3 | 0 | 2Vs/3 |

As shown in Table 1, since the signal STR0 is HIGH in the selected row block 11A, the first sub-bitline select switches 60 are turned on, whereby the potential of the main bitline MBL0 and the potential of the sub-bitline SBL00 are set at 0 V, and the potential of the main bitline MBL1 and the potential of the sub-bitline SBL10 are set at 2Vs/3. The selected word voltage Vs is applied to the wordline WL00, and the unselected word voltage Vs/3 is applied to the wordline WL10. Therefore, the voltage Vs is applied to the selected memory cell B1(00) in the selected row block 11A, whereby the polarization state transitions to the point A shown in FIG. 4 and the data is read. The unselect voltage ±Vs/3 is applied to the unselected memory cells B1(01), B1(10), and B1(11) in the selected row block 11A.

In the unselected row block 11B, the signals STR1, /STR1, and RBSS, the wordline WL01 and WL11, and the sub-bitlines SBL01 and SBL11 are set at potentials shown in Table 2.

TABLE 2

| Potentials in row block 11B | | | | | | |
|---|---|---|---|---|---|---|
| STR1 | /STR1 | RBSS | WL01 | WL11 | SBL01 | SBL11 |
| L | H | L | Vs/3 | Vs/3 | Vs/3 | Vs/3 |

As shown in Table 2, since the inverted signal /STR0 is HIGH in the unselected row block 11B, the second sub-bitline select switches 80 are turned on, whereby the potential of the common potential line 70, the potential of the sub-bitline SBL01, and the potential of the sub-bitline SBL11 are Vs/3. The unselected word voltage Vs/3 is applied to the wordlines WL01 and WL11. Therefore, 0 V is applied to all the unselected memory cells B2(00), B2(01), B2(10), and B2(11) in the unselected row block 11B.

In the present embodiment, the potential difference between each end of the unselected memory cell can be stabilized at 0 V without causing the sub-bitline 40 connected with the unselected memory cell in the unselected row block 11B to float. Therefore, the influence of disturbance noise can be ignored, whereby the unselected memory cell stably maintains the memory state at the point B or the point D shown in FIG. 4.

FIG. 5 illustrates the read operation which causes the polarization state to transition from the point B or the point D shown in FIG. 4 to the point A (or the write operation of logical value "0"). However, in the write operation of the logical value "1" which causes the polarization state to transition from the point B to the point C shown in FIG. 4 (or in the rewrite operation of logical value "1"), the applied voltage is also set at 0 V without causing the sub-bitlines 40 connected with the unselected memory cells in the unselected row block to be in a floating state.

2. Second Embodiment

Figure 6:
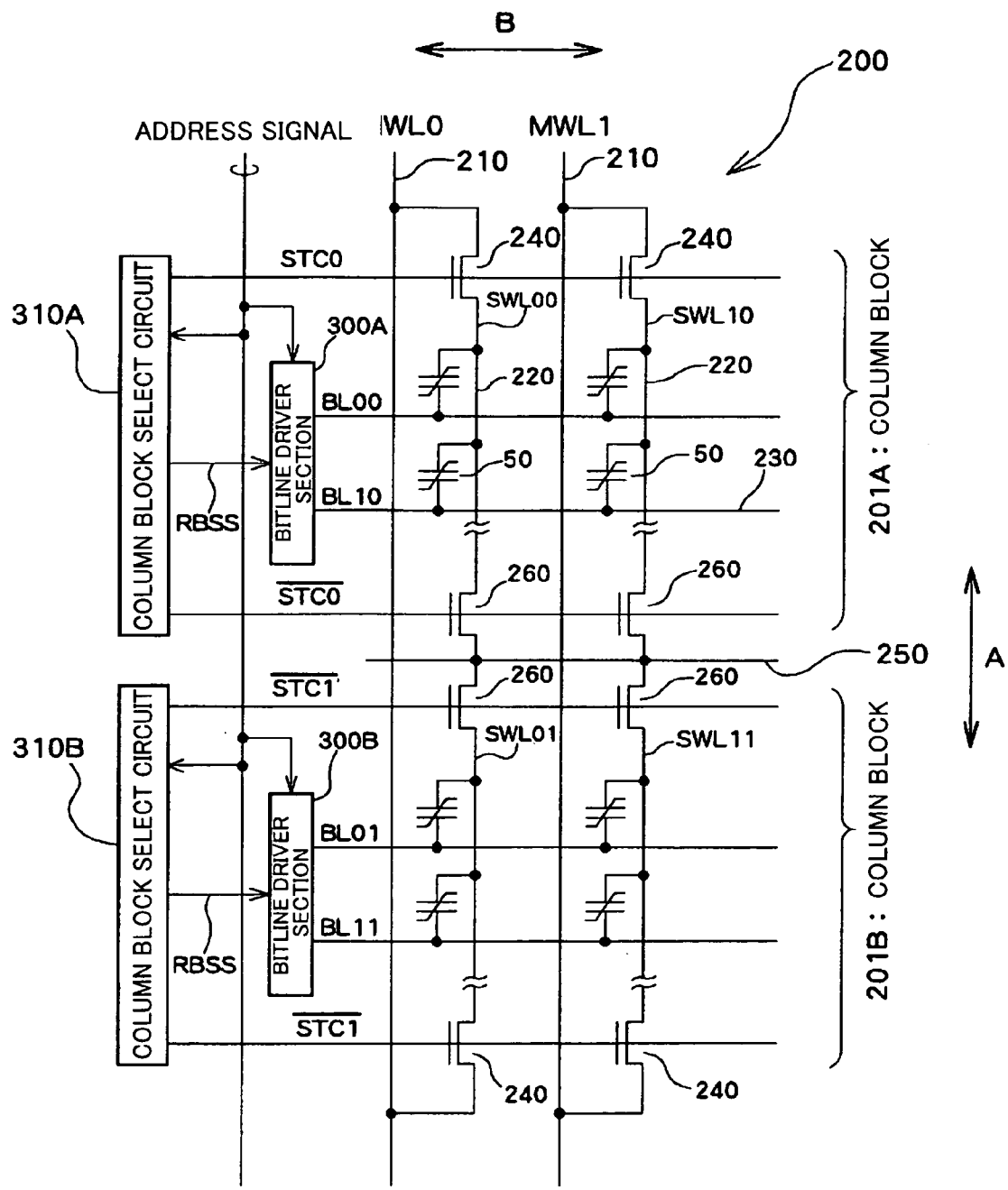
FIG. 6 is a diagram schematically showing a ferroelectric memory device according to a second embodiment of the present invention.

In a memory cell array region 200 shown in FIG. 6, a row direction A in which hierarchized main wordlines 210 and sub-wordlines 220 extend is defined as a first direction, and a column direction B in which bitlines 230 extend is defined as a second direction. However, the present invention is not limited thereto. The memory cell array region 200 shown in FIG. 6 is divided into a plurality of column blocks 201A, 201B, . . . at least in the row direction A.

Bitline driver sections 300A and 300B and block select circuits 310A and 310B are provided corresponding to the column blocks 201A and 201B, respectively.

In the present embodiment, the wordlines are hierarchized. Specifically, the sub-wordline 220 is provided for each of the main wordlines 210 in each of the column blocks 201A and 201B. In the column block 201A, the sub-wordline SWL00 is provided for the main wordline MWL0, and the sub-wordline SWL10 is provided for the main wordline MWL1. In the column block 201B, the sub-wordline SWL01 is provided for the main wordline MWL0, and the sub-wordline SWL11 is provided for the main wordline MWL1.

The ferroelectric capacitors (memory cells) 50 are provided at intersections of the sub-wordlines 220 subordinate to the main wordlines 210 and the bitlines 230.

A first sub-wordline select switch 240 is provided between the main wordline 210 and one end of the sub-wordline 220. A common potential supply line 250 which supplies a common potential to the sub-wordlines 220 is provided between the column blocks 201A and 201B. A second sub-wordline select switch 260 is provided between the other end of the sub-wordline 220 and the common potential supply line 250. The first and second sub-wordline select switches 240 and 260 connected with either end of one sub-wordline 220 are driven complementarily so that one of the sub-wordline select switches 240 and 260 is turned on when the other is turned off. Therefore, one sub-wordline 220 is connected with the main wordline 210 when the first sub-wordline select switch 240 is turned on, and connected with the common potential supply line 250 when the second sub-wordline select switch 260 is turned on. This prevents the sub-wordline 220 from floating.

The block select circuit 310A shown in FIG. 6 may have the same circuit configuration as that shown in FIG. 2. The bitline driver section 300A shown in FIG. 6 may have the same circuit configuration as that shown in FIG. 3. In this case, a selected bit voltage may be used as the select voltage, and an unselected bit voltage may be used as the unselect voltage.

Figure 7:
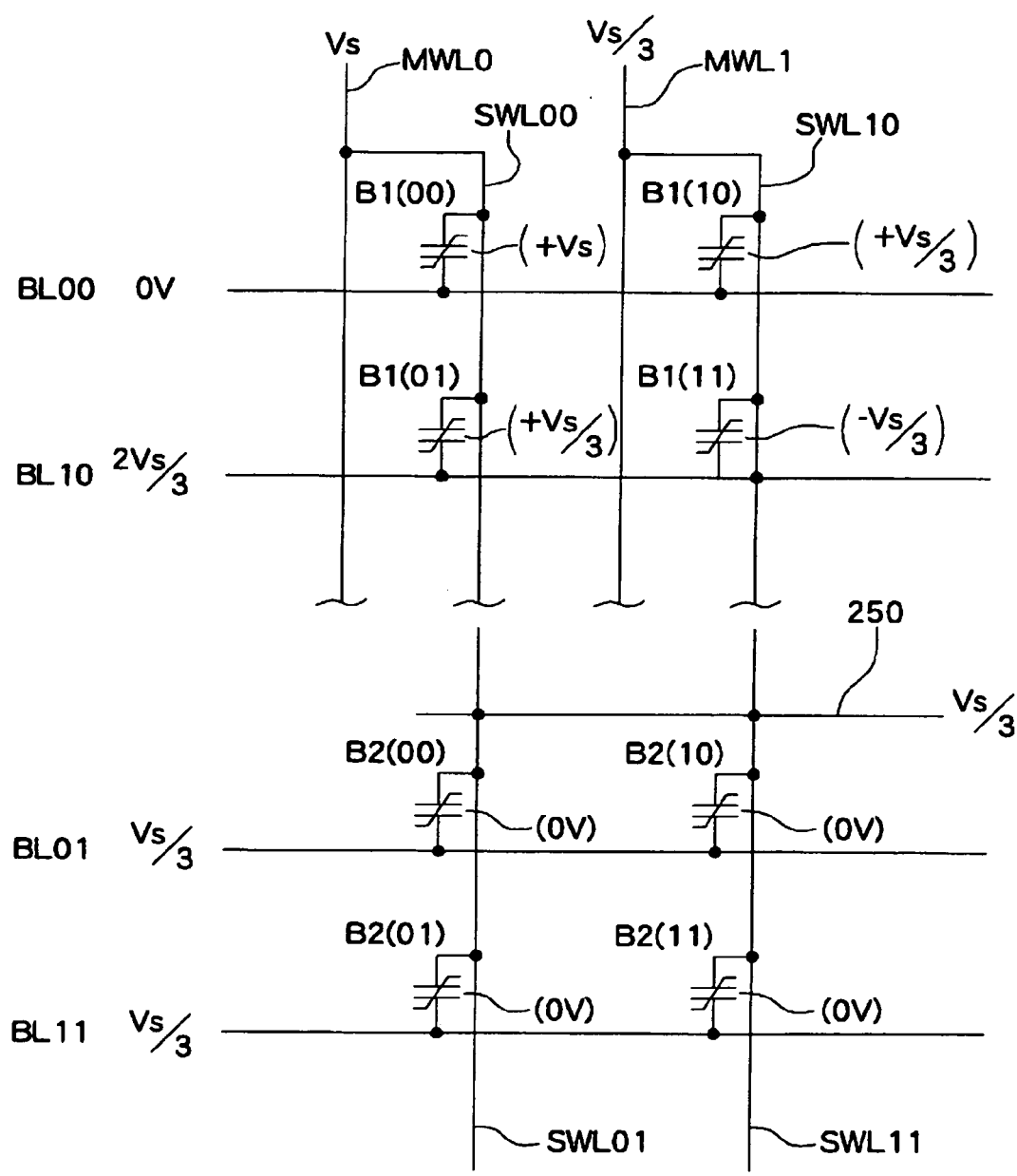
FIG. 7 is a diagram showing voltages applied to the ferroelectric memory device shown in FIG. 6 during a read operation.

FIG. 7 shows a potential setting in the case of reading data from the memory cell in the selected column block 201A of the memory cell array 200 shown in FIG. 6 (or in the case of writing logical value "0"). The selected memory cell is a memory cell B1(00) connected with the sub-wordline SWL00 and the bitline BL00 in the column block 201A. In the selected column block 201A, signals STC0, /STC0, and CBSS, the sub-wordlines SWL00 and SWL10, and the bitlines BL00 and BL10 are set at potentials shown in Table 3.

TABLE 3

| STC0 | /STC0 | CBSS | SWL00 | SWL10 | BL00 | BL10 |
|------|-------|------|-------|-------|------|------|
| H    | L     | H    | Vs    | Vs/3  | 0    | 2Vs/3 |

In the unselected column block 201B, the signals STC1, /STC1, and CBSS, the sub-wordlines SWL01 and SWL11, and the bitlines BL01 and BL11 are set at potentials shown in Table 4.

TABLE 4

| STC1 | /STC01 | CBSS | SWL01 | SWL11 | BL01 | BL11 |
|------|--------|------|-------|-------|------|------|
| L    | H      | L    | Vs/3  | Vs/3  | Vs/3 | Vs/3 |

The potential setting shown in FIG. 7 is substantially the same as the potential setting shown in FIG. 5. Therefore, in the present embodiment, the potential difference between each end of the unselected memory cell can be stabilized at 0 V without causing the sub-wordline 220 connected with the unselected memory cell in the unselected column block 201B to float. Therefore, the influence of disturbance noise can be ignored, whereby the unselected memory cell stably maintains the memory state at the point B or the point D shown in FIG. 4.

3. Third Embodiment

Figure 8:
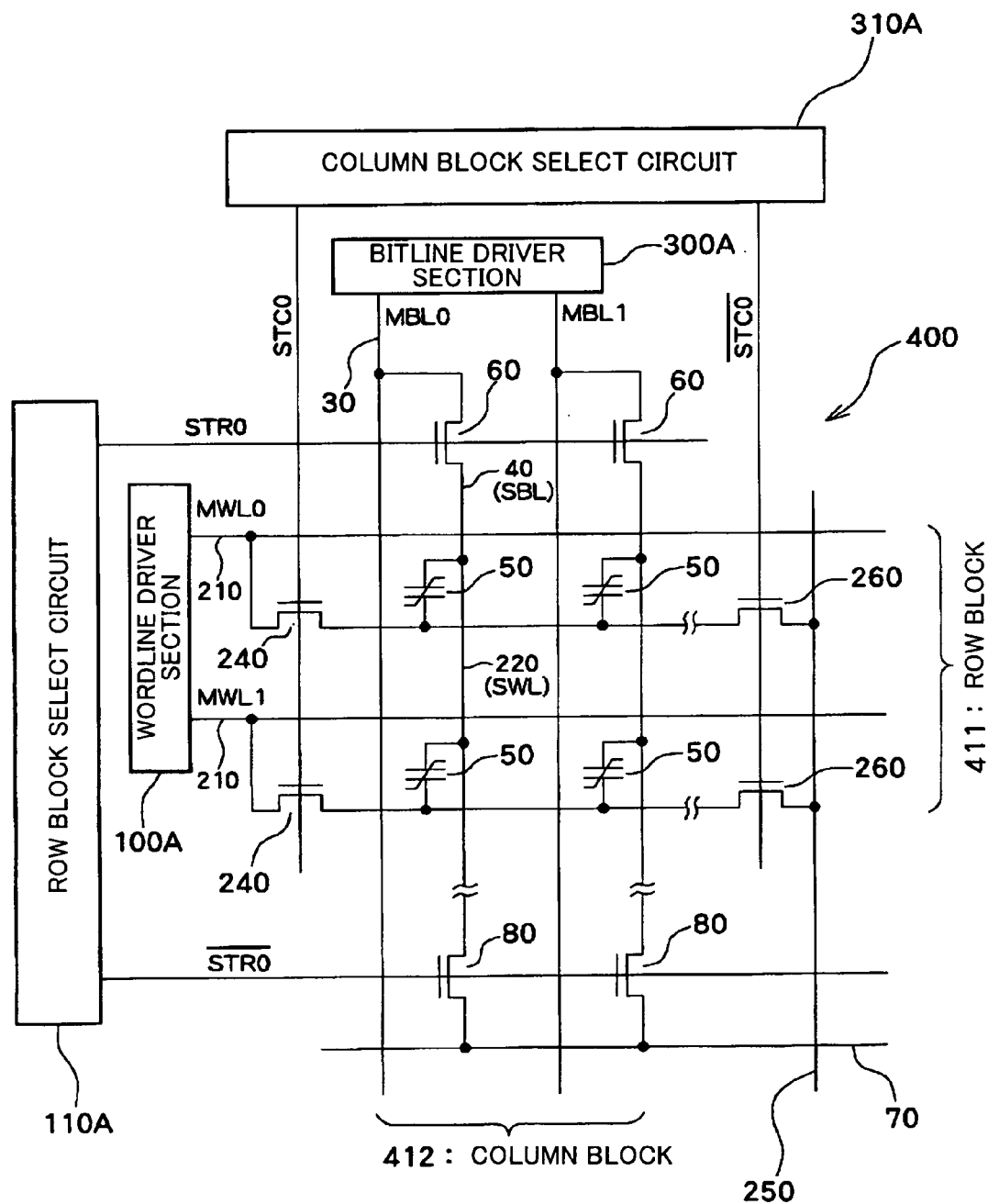
FIG. 8 is a diagram schematically showing a ferroelectric memory device according to a third embodiment of the present invention.

The configuration shown in FIG. 8 is the first embodiment shown in FIG. 1 combined with the second embodiment shown in FIG. 6. In FIG. 8, components having the same function as the components in FIGS. 1 and 6 are denoted by the same reference numbers.

In a memory cell array region 400 shown in FIG. 8, a row block 411 is formed in units of the sub-bitlines 40 subordinate to the main bitlines 30, and a column block 412 is formed in units of the sub-wordlines 220 subordinate to the main wordlines 210.

As is clear from the first and second embodiments, in the third embodiment in which the first and second embodiments are combined, the sub-bitline 40 and the sub-wordline 220 connected with the unselected memory cell in the unselected block can be set at the common potential (Vs/3) through the first and the second common potential supply lines 70 and 250 without causing the sub-bitline 40 and the sub-wordline 220 to float. Therefore, the potential difference between each end of the unselected memory cell in the unselected block can be stabilized at 0 V. Therefore, the influence of disturbance noise can be ignored, whereby the unselected memory cell stably maintains the memory state at the point B or the point D shown in FIG. 4.

4. Modifications

The potentials during the operation period in which one of the blocks is selected are described in the first and second embodiments. A period in which no block is selected is referred to as a standby period.

In the standby period, the second sub-bitline select switches 80 are turned on in all the row blocks, whereby all the sub-bitlines are connected with the common potential supply line 70. In the standby period, the second sub-wordline select switches 260 are turned on in all the column blocks, whereby all the sub-wordlines are connected with the common potential supply line 250.

In this standby period, it is preferable to set the main wordlines (wordlines) 210 (20), the main bitlines (bitlines) 30 (230), and the common potential supply lines 70 and 250 at the same potential without causing these lines to float. This enables the potential difference between each end of all the memory cells to be set at 0V during the standby period, whereby the memory state of the memory cells can be stably maintained.

The same potential of these lines may be set when turning the power on. Since the ferroelectric memory device enters the standby state after turning the power on, the above-described effect can be achieved promptly.

The same potential may be equal to the potential of the common potential supply lines 70 and 250 during the operation period (Vs/3 in the present embodiment). In this case, it is unnecessary to charge/discharge the unselected wordlines (unselected main wordlines and unselected sub-wordlines) and the common potential supply line when transitioning to the operation period from the standby period, whereby an increase in speed and reduction of current consumption can be achieved.

In the third embodiment, it is preferable to connect the first and second common potential supply lines with different test terminals. The logical value "0" or "1" can be written into all the memory cells at the same time by applying different potentials to the first and second common potential supply lines during a test period.

In the first to third embodiments, the first and second sub-bitline select switches and the first and second sub-wordline select switches may be turned off during a potential change transitional period immediately after turning the power on. This prevents an unexpected excessive voltage from being applied to the memory cells. There may be a case where a defect occurs in the memory cell in one block and a redundant block is used instead of the defective block. In this case, the first and second sub-bitline select switches and the first and second sub-wordline select switches in the defective block may be turned off.

What is claimed is:

1. A ferroelectric memory device comprising:
   a memory cell array region;
   a plurality of wordlines arranged in parallel to each other in a first direction within the memory cell array region;
   a plurality of main bitlines arranged in parallel to each other in a second direction intersecting the first direction within the memory cell array region;
   a plurality of blocks into which the memory cell array region is divided in the second direction;
   a plurality of sub-bitlines provided for each of the main bitlines, each of the sub-bitlines being provided within one of the blocks;
   a plurality of ferroelectric memory cells respectively provided at intersections between the sub-bitlines and the wordlines;
   a plurality of first sub-bitline select switches respectively provided between the main bitlines and one ends of the sub-bitlines;
   a common potential supply line which supplies a common potential to the sub-bitlines;
   a plurality of second sub-bitline select switches respectively provided between the common potential supply line and the other ends of the sub-bitlines; and
   a plurality of block select sections provided corresponding to the blocks,
   wherein one of the block select sections selected from among the block select sections turns on the first sub-bitline select switches and turns off the second sub-bitline select switches in corresponding one of the blocks; and
   wherein unselected block select sections among the block select sections turn off the first sub-bitline select switches and turn on the second sub-bitline select switches in corresponding two or more of the blocks.

2. The ferroelectric memory device as defined in claim 1, wherein the common potential is substantially the same as an unselected wordline potential which is supplied to unselected blocks among the blocks.

3. The ferroelectric memory device as defined in claim 1, wherein during a standby period in which no block is selected, the first sub-bitline select switches are turned off and the second sub-bitline select switches are turned on in all the blocks, and the common potential is substantially the same as a wordline potential during the standby period.

4. The ferroelectric memory device as defined in claim 3, wherein potentials of the wordlines, the main bitlines, and the common potential supply line are set at the same potential during the standby period after turning the power on.

5. The ferroelectric memory device as defined in claim 4, wherein the same potential is equal to the potential of the common potential supply line during an operation period.

6. A ferroelectric memory device comprising:
   a memory cell array region;
   a plurality of main wordlines arranged in parallel to each other in a first direction within the memory cell array region;
   a plurality of bitlines arranged in parallel to each other in a second direction intersecting the first direction within the memory cell array region;
   a plurality of blocks into which the memory cell array region is divided in the first direction;
   a plurality of sub-wordlines provided for each of the main wordlines, each of the sub-wordlines being provided within one of the blocks;
   a plurality of ferroelectric memory cells respectively provided at intersections between the sub-wordlines and the bitlines;
   a plurality of first sub-wordline select switches respectively provided between the main wordlines and one ends of the sub-wordlines;
   a common potential supply line which supplies a common potential to the sub-wordlines;
   a plurality of second sub-wordline select switches respectively provided between the common potential supply line and the other ends of the sub-wordlines; and
   a plurality of block select sections provided corresponding to the blocks,
   wherein one of the block select sections selected from among the block select sections turns on the first sub-wordline select switches and turns off the second sub-wordline select switches in corresponding one of the blocks; and
   wherein unselected block select sections among the block select sections turn off the first sub-wordline select switches and turn on the second sub-wordline select switches in corresponding two or more of the blocks.

7. The ferroelectric memory device as defined in claim 6, wherein the common potential is substantially the same as an unselected bitline potential which is supplied to unselected blocks among the blocks.

8. The ferroelectric memory device as defined in claim 6, wherein during a standby period in which no block is selected, the first sub-wordline select switches are turned off and the second sub-wordline select switches are turned on in all the blocks, and the common potential is substantially the same as a bitline potential during the standby period.

9. The ferroelectric memory device as defined in claim 8, wherein potentials of the bitlines, the main wordlines, and the common potential supply line are set at the same potential during the standby period after turning the power on.

10. The ferroelectric memory device as defined in claim 9, wherein the same potential is equal to the potential of the common potential supply line during an operation period.

11. A ferroelectric memory device comprising:
   a memory cell array region divided into blocks in first and second directions intersecting each other;
   a plurality of main wordlines arranged in parallel in the first direction within the memory cell array region;
   a plurality of main bitlines arranged in parallel in the second direction within the memory cell array region;
   a plurality of sub-wordlines provided for each of the main wordlines, each of the sub-wordlines being provided within one of the blocks;
   a plurality of sub-bitlines provided for each of the main bitlines, each of the sub-bitlines being provided within one of the blocks;
   a plurality of ferroelectric memory cells respectively provided at intersections between the sub-wordlines and the sub-bitlines;
   a plurality of first sub-wordline select switches respectively provided between the main wordlines and one ends of the sub-wordlines;

a plurality of first sub-bitline select switches respectively provided between the main bitlines and one ends of the sub-bitlines;

a first common potential supply line which supplies a common potential to the sub-wordlines;

a second common potential supply line which supplies a common potential to the sub-bitlines;

a plurality of second sub-wordline select switches respectively provided between the first common potential supply line and the other ends of the sub-wordlines;

a plurality of second sub-bitline select switches respectively provided between the second common potential supply line and the other ends of the sub-bitlines;

a plurality of first block select sections provided corresponding to the blocks divided in the second direction;

a plurality of second block select sections provided corresponding to the blocks divided in the first direction; and a plurality of second block select sections provided corresponding to the plurality of blocks divided in the first direction, wherein one of the first block select sections selected from among the first block select sections turns on the first sub-wordline select switches and turns off the second sub-wordline select switches in corresponding one of the blocks; and wherein unselected first block select sections among the first block select sections turn off the first sub-wordline select switches and turn on the second sub-wordline select switches in corresponding two or more of the blocks.

wherein one of the second block select sections selected from among the second block select sections turns on the first sub-bitline select switches and turns off the second sub-bitline select switches in corresponding one of the blocks; and wherein unselected second block select sections among the second block select sections turn off the second sub-bitline select switches and turn on the second sub-bitline select switches in corresponding two or more of the blocks.

12. The ferroelectric memory device as defined in claim 11, wherein during a standby period in which no block is selected, the first sub-bitline select switches and the first sub-wordline select switches are turned off and the second sub-bitline select switches and the second sub-wordline select switches are turned on in all the blocks.

13. The ferroelectric memory device as defined in claim 12, wherein potentials of the main wordlines, the main bitlines, and the first and second common potential supply lines are set at the same potential during the standby period after turning the power on.

14. The ferroelectric memory device as defined in claim 11, wherein the first and second common potential supply lines are connected to different test terminals.

15. The ferroelectric memory device as defined in claim 13, wherein the same potential is equal to the potential of the first and second common potential supply lines during an operation period.

* * * * *